(12) United States Patent
Bisen et al.

(10) Patent No.: US 8,762,626 B2
(45) Date of Patent: Jun. 24, 2014

(54) DATA MODIFICATION BASED ON MATCHING BIT PATTERNS

(75) Inventors: Omprakash Bisen, Bangalore (IN); Abdulla Pichen, Bangalore (IN)

(73) Assignee: Sandisk Technologies Inc., Plano, TX (US)

( * ) Notice: Subject to any disclaimer, the term of this patent is extended or adjusted under 35 U.S.C. 154(b) by 379 days.

(21) Appl. No.: 13/272,648

(22) Filed: Oct. 13, 2011

(65) Prior Publication Data

US 2013/0067140 A1    Mar. 14, 2013

(30) Foreign Application Priority Data

Sep. 12, 2011   (IN) .......................... 2556/MUM/2011

(51) Int. Cl.
| | |
|---|---|
| *G06F 12/00* | (2006.01) |
| *G06F 12/02* | (2006.01) |
| *G06F 11/10* | (2006.01) |
| *G11C 11/56* | (2006.01) |
| *G11C 29/42* | (2006.01) |
| *G11C 16/04* | (2006.01) |

(52) U.S. Cl.
CPC ........ *G06F 11/1072* (2013.01); *G11C 11/5628* (2013.01); *G11C 16/0483* (2013.01); *G11C 2211/5647* (2013.01)
USPC ................... 711/103; 711/154; 711/E12.001; 711/E12.008; 714/701

(58) Field of Classification Search
None
See application file for complete search history.

(56) References Cited

U.S. PATENT DOCUMENTS

| | | | |
|---|---|---|---|
| 7,924,628 | B2 | 4/2011 | Danon et al. |
| 2008/0158948 | A1 | 7/2008 | Sharon et al. |
| 2008/0205145 | A1 | 8/2008 | Kanno et al. |
| 2009/0067244 | A1 | 3/2009 | Li et al. |
| 2009/0204824 | A1 | 8/2009 | Lin et al. |
| 2009/0259803 | A1 | 10/2009 | Oh et al. |
| 2010/0128524 | A1 | 5/2010 | Hadas et al. |
| 2010/0146192 | A1 | 6/2010 | Weingarten et al. |
| 2010/0275094 | A1 | 10/2010 | Honda |
| 2011/0016370 | A1 | 1/2011 | Chen |

OTHER PUBLICATIONS

The International Search Report and Written Opinion of the International Searching Authority mailed Nov. 6, 2012 in International Application No. PCT/US2012/052087, 10 pages.

*Primary Examiner* — Kevin Verbrugge
(74) *Attorney, Agent, or Firm* — Toler Law Group, PC

(57) ABSTRACT

A data storage device includes a memory and a controller. The controller is configured to identify groups of bits that match any bit pattern in a first set of bit patterns. Each of the groups of bits includes a first bit of first data, a second bit of second data, and a third bit of third data to be stored at the memory. The controller is configured, in response to determining that a count of the identified groups exceeds a threshold, to change multiple bits of the first data. Changing the multiple bits of the first data reduces a number of the groups of bits that match any bit pattern in the first set of bit patterns.

26 Claims, 5 Drawing Sheets

DATA MODIFICATION BASED ON MATCHING BIT PATTERNS

FIELD OF THE DISCLOSURE

The present disclosure is generally related to data storage and retrieval.

BACKGROUND

Error detection and correction processes help maintain data integrity within memory storage devices. Error correction code (ECC) processes are commonly used for error detection in computer memory subsystems. For example, an ECC may be used during a read operation to determine whether accessed data bits (e.g., memory cells representing information retrieved by a processor) have incorrect values. ECC processing may increase operational reliability of memory devices by detecting a number of erroneous bits and correcting the erroneous bits based on the correction capacity of the particular ECC technique that is applied. Despite the advances afforded by use of the ECC, it would be desirable to be able to reduce a number of errors occurring during storage of data at memory storage devices.

SUMMARY

Systems and methods of data modification based on matching bit patterns can improve overall reliability of data stored at a memory. Because some bit patterns may be stored in the memory more reliably than other bit patterns, data that matches a less-reliable bit pattern may be modified to match a more-reliable bit pattern prior to storage at the memory.

DETAILED DESCRIPTION

Figure 1:
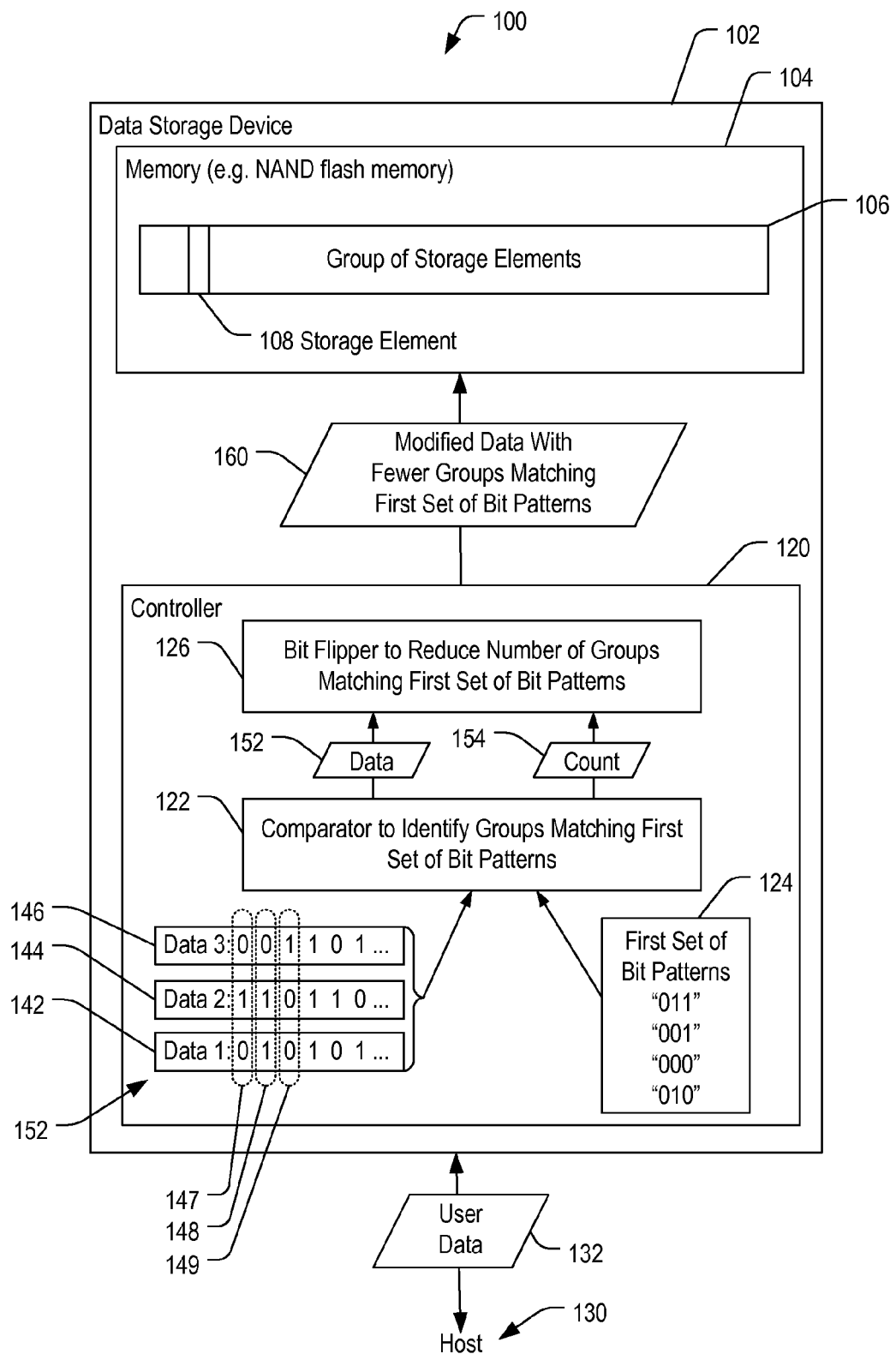
FIG. 1 is a block diagram of a particular illustrative embodiment of a system including a data storage device configured to modify data based on matching bit patterns.

Referring to FIG. 1, a particular embodiment of a system 100 includes a data storage device 102 coupled to a host device 130. The data storage device 102 is configured to receive user data 132 from the host device 130 and to modify the user data 132 based on bit values of the user data 132 to improve a reliability of data storage at a memory 104 of the data storage device 102.

The host device 130 may be configured to provide data, such as the user data 132, to be stored at the memory 104 or to request data to be read from the memory 104. For example, the host device 130 may include a mobile telephone, a music or video player, a gaming console, an electronic book reader, a personal digital assistant (PDA), a computer, such as a laptop computer or notebook computer, any other electronic device, or any combination thereof.

The data storage device 102 includes the memory 104 coupled to a controller 120. The memory 104 may be a non-volatile memory, such as a NAND flash memory. The memory 104 includes a representative group 106 of storage elements, such as a word line of a multi-level cell (MLC) flash memory. The group 106 includes a representative storage element 108, such as a flash MLC cell. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples.

The controller 120 is configured to receive data and instructions from and to send data to the host device 130 while the data storage device 102 is operatively coupled to the host device 130. The controller 120 is further configured to send data and commands to the memory 104 and to receive data from the memory 104. For example, the controller 120 is configured to send data and a write command to instruct the memory 104 to store the data to a specified address. As another example, the controller 120 is configured to send a read command to read data from a specified address of the memory 104.

The controller 120 includes a comparator 122 and a bit flipper 126. The comparator 122 is configured to identify groups of data that match a first set of bit patterns 124. The comparator 122 is configured to receive data 152, such as the user data 132 or other data that may be generated within the controller 120. The data 152 is represented as including a first logical page including first data 142, a second logical page including second data 144, and a third logical page including third data 146. The first data 142 is illustrated as having a left-most bit (e.g. a most significant bit) having a "0" value, the second data 144 is represented as having a left-most bit having a "1" value, and the third data 146 is represented as having a left-most bit having a "0" value. The left-most bit of each of the data 142-146 form a first representative group 147 of bits. A second representative group 148 and a third representative group 149 are also illustrated.

The comparator 122 is configured to receive the data 152 and to identify groups that match the first set of bit patterns 124, such as the first group 147. To illustrate, the first set of bit patterns 124 includes a first bit pattern "011", a second bit pattern "001", a third bit pattern "000", and a fourth bit pattern "010". The comparator 122 may be configured to compare each group of bits of the data 152, such as the representative groups 147-149, to each of the bit patterns of the first set of bit patterns 124 and to determine a count 154 of the identified groups of bits that match any bit pattern in the first set of bit patterns 124. The comparator 122 may be configured to provide the data 152 and the count 154 of groups of bits that match the first set of bit patterns 124 to the bit flipper 126.

The bit flipper 126 is configured to reduce a number of groups in the data 152 that match the first set of bit patterns 124. For example, in response to the bit flipper 126 determining that the count 154 exceeds a threshold, the bit flipper 126 may change multiple bits of the first data 142. Changing multiple bits of the first data 142 may cause the resulting data (i.e. the modified first data 142, the second data 144, and the third data 146) to have a reduced count of groups of bits that match the first set of bit patterns 124, as explained in more detail with respect to FIGS. 3-4.

The controller 120 is configured to provide modified data 160 with fewer groups of bits matching the first set of bit patterns 124 than the data 152. For example, the modified data 160 may include the data 152 after being modified by the bit flipper 126 and encoded as an error correcting code (ECC) prior to storage in the memory 104. The controller 120 is configured to send the modified data 160 to be stored at the memory 104, such as within the representative group 106 of storage elements.

Each group 147-149 of bits of the data 152 may correspond to a single memory element of the group 106 of storage elements. For example, the third group 149 may correspond to a three-bit value to be stored to the representative storage element 108. Data stored at the storage element 108 may be statistically more reliable when the stored data does not match any of the bit patterns of the first set of bit patterns 124. For example, one or more bits of data stored at the storage element 108 may have a decreased sensitivity to state changes of the storage element 108 when the stored data does not match any of the bit patterns of the first set of bit patterns, as described with respect to FIGS. 3-4. The bit flipper 126 may modify bit values of the first data 142 to cause groups of bits to transition from matching a bit pattern in the first set of bit patterns 124 to not matching any of the bit patterns in the first set of bit patterns 124. By modifying the data 152 to reduce the number of groups of bits that match any bit pattern in the first set of bit patterns 124, a reliability of data stored in the group 106 of storage elements may be increased.

The controller 120 may generate one or more additional bits indicating whether the modified data 160 was modified from the original data 152 by the bit flipper 126. To illustrate, the controller 120 may add an indicator such as a flag bit having a value of "0" to the modified data 160 to indicate that the group 106 of storage elements store data that was not modified by the bit flipper 126. Alternatively, the controller 120 may add a flag bit having a value of "1" to the modified data 160 to indicate that the group 106 of storage elements store data that was modified by the bit flipper 126. In other implementations, the indicator may include multiple bits. For example, some portions of the data 152 may be modified by the bit flipper 126 and other portions of the data 152 may not be modified by the bit flipper 126. Multiple bits may be used to indicate which portions of the data 152 were modified. The indicator may be added to the modified data 160 (e.g. prior to ECC encoding) or may be stored separately from the modified data 160, such as in a header or meta-data portion of the memory 104, or at another non-volatile memory that is accessible to the controller 120.

Upon receiving a request to read the modified data 160 from the group, the indicator may be used to determine whether to modify the retrieved data. For example, in response to receiving from the host device 130 a request for read access to an address of the memory 104 corresponding to the group 106, a representation of the modified data 160 (e.g. possibly including one or more bit errors) is read from the memory 104 and may be processed by an ECC decoder. The controller 120 may determine whether to change any bits of the data based on a value of the indicator. For example, when the indicator has a value indicating that one or more bits of the data 152 were changed prior to storage in the memory 104, the controller 120 may route the retrieved data to the bit flipper 126 to restore the original data 152. The restored data 152 may be sent to the host device 130.

By selectively flipping bits of the data 152 prior to storage in the memory 104, a sensitivity of the data 152 to changes of states of the storage elements may be reduced. As a result, a reliability of stored data may be improved due to fewer bit errors occurring during storage in the memory 104. Improved reliability may enable operation using a less-powerful ECC engine, resulting in reduced power consumption, reduced device size, reduced manufacturing cost, or a combination thereof. Alternatively, or in addition, improved reliability may enable longer operational life of the memory 104.

Figure 2:
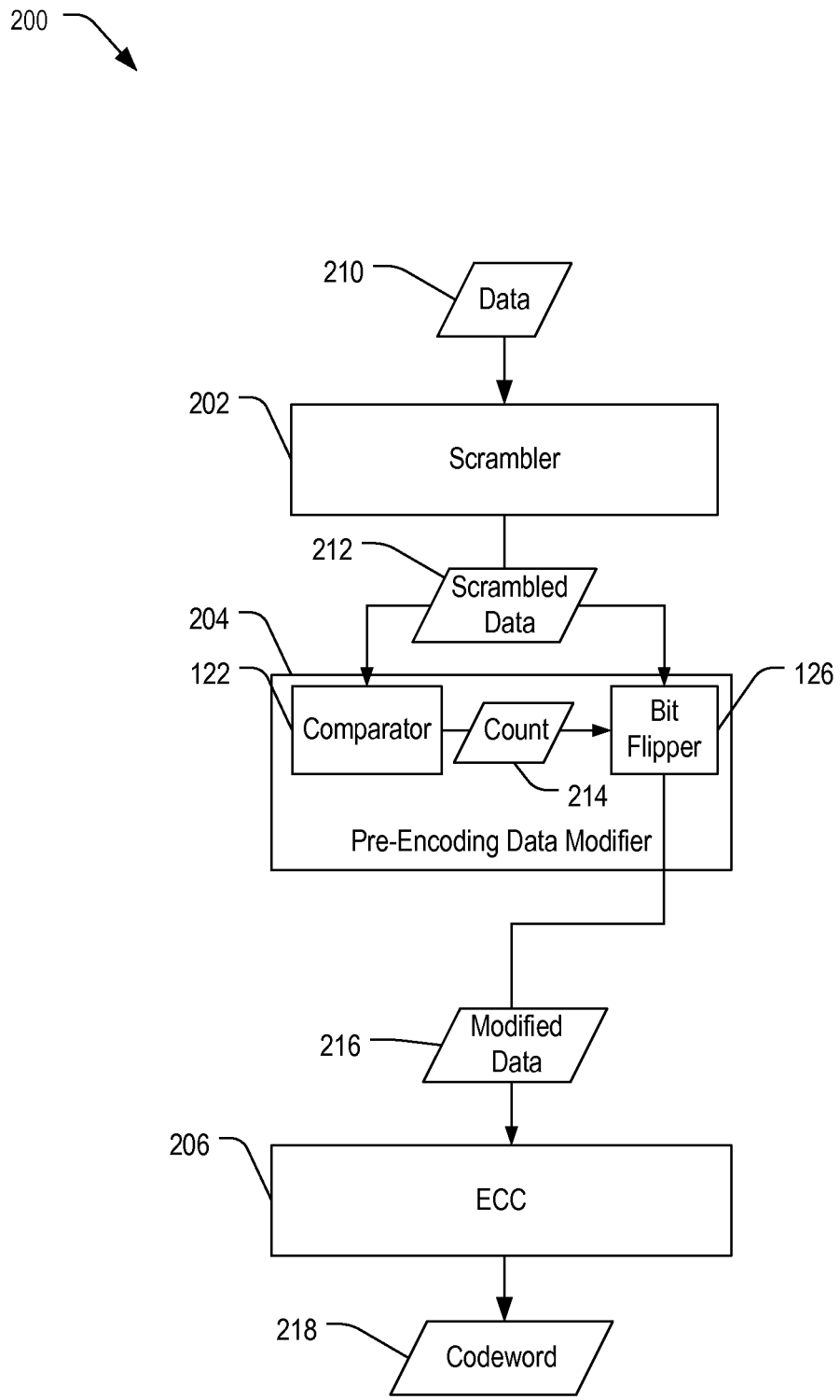
FIG. 2 is a block diagram illustrating a particular embodiment of components that may be incorporated in the data storage device of FIG. 1.

Referring to FIG. 2, an embodiment of components that may be incorporated in the data storage device 102 of FIG. 1 is illustrated and generally designated 200. A pre-encoding data modifier 204 is coupled to a scrambler 202 and to an ECC engine 206. The scrambler 202 is configured to receive incoming data 210 and to modify the incoming data 210. For example, the scrambler 202 may include a linear feedback shift register (LFSR) configured to generate a scrambling key. The scrambler 202 may further include exclusive-or (XOR) logic configured to apply an exclusive-or operation on each bit of the incoming data 210 with a corresponding bit of a scrambling key to generate scrambled data 212. The scrambler 202 may include one or more other mechanisms to generate the scrambled data 212, such as storage of a pre-generated scrambling key.

The pre-encoding data modifier 204 includes the comparator 122 and the bit flipper 126 of FIG. 1. The comparator 122 and the bit flipper 126 are each configured to receive the scrambled data 212. The comparator 122 is configured to generate a count of groups of bits in the scrambled data 212 matching a first set of bit patterns, such as the first set of bit patterns 124. The bit flipper 126 is configured to receive the scrambled data 212 and the count 214 from the comparator 122 and to selectively change multiple bits of the scrambled data 212 in response to determining that the count 214 exceeds a threshold. Changing the multiple bits of the scrambled data 212 reduces a number of the groups of bits that match any bit pattern of the first set of bit patterns. The bit flipper 126 is configured to generate output data, illustrated as modified data 216, to the ECC engine 206. Although the output of the bit flipper 126 is illustrated as modified data 216, it should be understood that if the count 214 does not exceed the threshold, the bit flipper 126 may make no modifications to the scrambled data 212, and the bit flipper 126 may output unmodified data to the ECC engine 206.

The ECC engine 206 is configured to receive the data output from the bit flipper 126 and to generate a codeword 218. For example, the ECC engine 206 may employ an ECC decoding scheme, such as a Reed Solomon ECC, a Bose-Chaudhuri-Hocquenghem (BCH) ECC, one or more other ECC decoding schemes, or any combination thereof.

During operation, the system 200 may be implemented in the controller 120 of the data storage device 102 of FIG. 1. The user data 132 of FIG. 1 may be received as the data 210 and provided to the scrambler 202. The scrambler 202 may generate the scrambled data 212 that is provided to the pre-encoding data modifier 204. The pre-encoding data modifier 204 may identify groups of bits that match any bit pattern in the first set of bit patterns 124 and, in response to determining that the count 214 of the identified groups exceeds the threshold, the bit flipper 126 may change multiple bits of the scrambled data 212. The pre-encoding data modifier 204 provides output data 216 to the ECC engine 206. The ECC engine 206 may encode the received data by adding additional redundant data to enable error detection and recovery and outputs the codeword 218. The codeword 218 may be provided as the modified data 160 of FIG. 1 to be stored in the group 106 of storage elements. Data may therefore be examined and modified to provide a statistically higher reliability during storage of the data at a memory.

Figure 3:
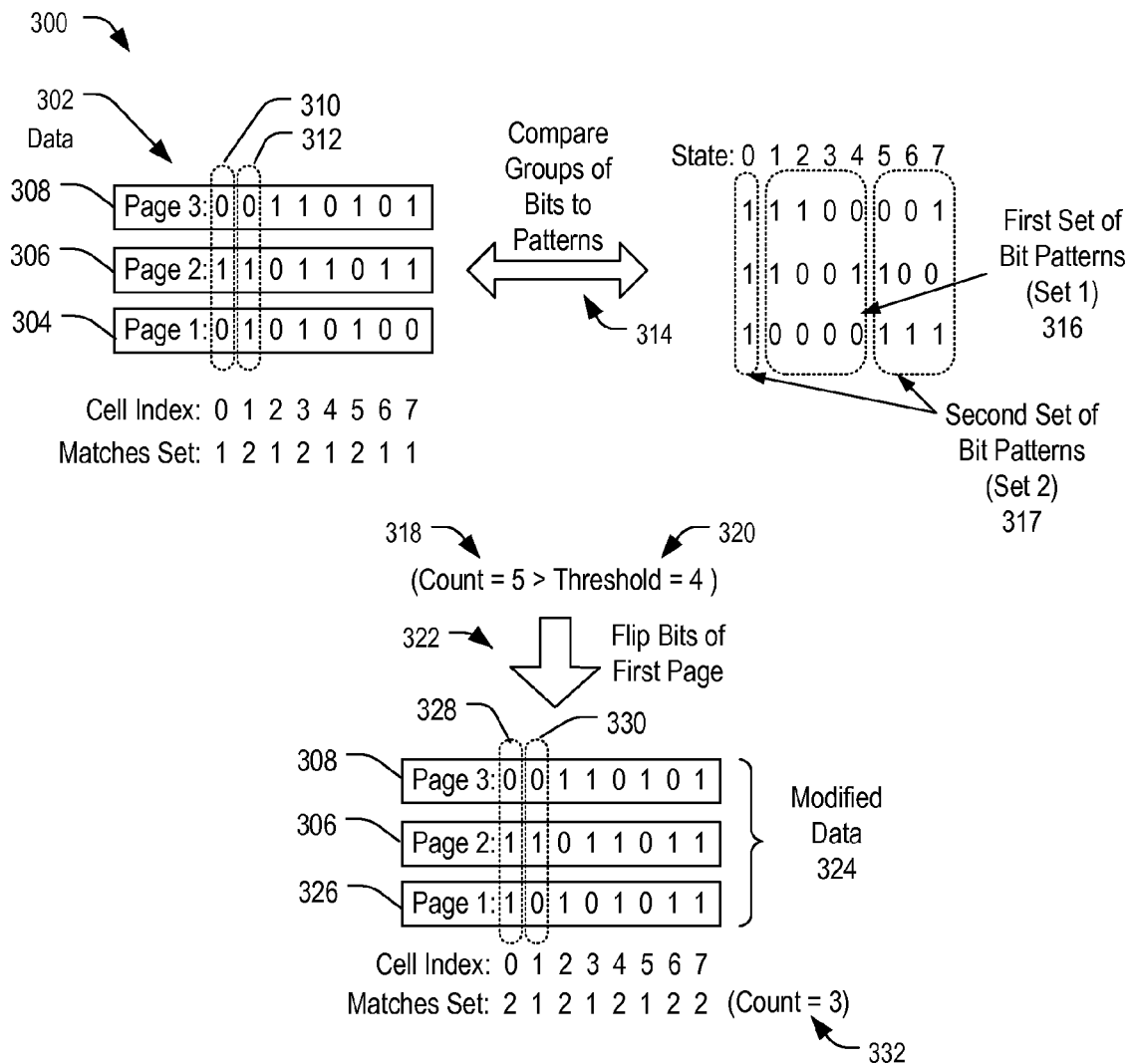
FIG. 3 is a general diagram that illustrates modifying data based on matching bit patterns for a memory that stores three bits per storage element.

Referring to FIG. 3, a particular embodiment of modifying data according to matching bit patterns is depicted and generally designated 300. Data 302 is illustrated as including a first page 304, a second page 306, and a third page 308. Logical groups of the data 302 are illustrated, including a first representative group 310 and a second representative group 312. Each of the groups includes a first bit of first data (the first page 304), a second bit of second data (the second page 306), and a third bit of third data (the third page 308). The groups of bits may be formed of bit values having common indices, such as the first group 310 of FIG. 3 that is formed of the left-most bits (i.e. bits having a "0" index) in the first page 304, the second page 306, and the third page 308. Alternatively, some or all of the groups may be formed of bits having non-common indices. Although the pages 304-308 are illustrated as having eight bits each, it should be understood that each of the pages 304-308 may have more than eight bits each. For example, each of the pages 304-308 may be a logical page that includes one thousand bits or more.

As illustrated in FIG. 3, a state of a memory element, such as a flash MLC cell, is illustrated as having a state number from 0-7 and a corresponding set of data bits for each state. To illustrate, state 0 corresponds to a bit pattern "111". State 1 corresponds to a bit pattern "110". The bit patterns are illustrated as logically partitioned into a first set of bit patterns 316 and a second set of bit patterns 317. Each bit pattern in the first set of bit patterns 316 is different from every other bit pattern in the first set of bit patterns 316. Each bit pattern in the second set of bit patterns 317 is different from each bit pattern in the first set of bit patterns 316.

The middle bit of each of the bit patterns is illustrated as having a "1" value in states 0-1, a "0" value in states 2-3, a "1" value in states 4-5, and a "0" value in states 6-7. Thus, the middle bit experiences three transitions in value from state 0 to state 7, as opposed to two transitions for the upper bit and two transitions for the bottom bit. As a result, the middle bit may be statistically more likely to experience a bit error due to changes in a state of a memory element. For example, when the memory element is a flash MLC cell, randomly occurring changes in a threshold voltage of the cell are more likely to result in an error in the middle bit than in the upper bit or the bottom bit. In order to improve a statistical reliability of data stored in the storage element, the data may be modified to reduce a number of transitions of the middle bit. As illustrated, the first set of bit patterns 316 includes four bit patterns (i.e., half of the patterns are in the first set 316 and half of the patterns are in the second set 317). However, the middle bit in the first set of bit patterns 316 experiences two transitions (between state 1 and state 2 and between state 3 and state 4) while the middle bit in the second set 317 experiences a single transition (between state 5 and state 6). Modifying the data 302 to reduce a number of groups matching the first set of bit patterns 316 and increasing the number of groups that match the second set of bit patterns 317 increases an overall reliability of the data 302.

A comparison operation 314 compares groups of bits of the data 302, such as the first representative group 310, to patterns of a first set of bit patterns 316. A count 318 of groups of bits matching any bit pattern in the first set of bit patterns 316 may be generated. A comparison, such as may be performed by the controller 120 of FIG. 1, may determine that the count 318 has a value that exceeds a threshold 320.

As illustrated, the data 302 includes the first group 310 matching the first set 316, the second group 312 matching the second set 317, and a total number of groups matching any bit pattern in the first set of bit patterns 316 (i.e. the count 318) equal to 5. The count 318 may be compared to the threshold 320, illustrated as having a value of four. For example, because each page 304-308 is illustrated as having eight bits, a threshold value of four corresponds to half of the number of groups in the data 302. Because the count 318 exceeds the threshold 320, multiple bits of the first page 304 may be flipped, at 322. In resulting modified data 324, every bit in the modified first page 326 has been flipped so that every "1" value in the first page 304 corresponds to a "0" value in the modified page 326 and every "0" value in the first page 304 corresponds to a "1" value in the modified page 326. By changing the bit values of the first page 304, every group of bits of the data 302 corresponding to the first set 316 is modified to correspond to the second set 317, and every group of bits of the data 302 corresponding to the second set 317 is modified to correspond to the first set 316. As a result, when more than half of the groups in the data 302 match the first set 316, flipping every bit in the first page 304 results in the modified data 324 having more groups in the second set 317 than in the first set 316. An overall reliability of data stored in a memory may be increased by decreasing sensitivity of the middle bit to changes in the threshold voltage of the single memory element into which the group of bits is stored.

Although FIG. 3 describes flipping bits of the first data (e.g. the first page 304) to improve a reliability of second data (e.g. the second page 306), it should be understood that in other embodiments bits of the second page 306 or of the third page 308 (instead of the first page 304) may be flipped to improve a reliability of stored data. For example, a data storage device may use a different mapping of bit patterns to states 0-7 of the storage elements than illustrated in FIG. 3. Data errors of a particular page may be reduced by logically partitioning the states 0-7 into a first set of states that has more transitions in the particular page than a second set of states. Another page of data may be modified to reduce a number of memory elements having a state in the first set of states and to increase a number of memory elements having a state in the second set of states.

Figure 4:
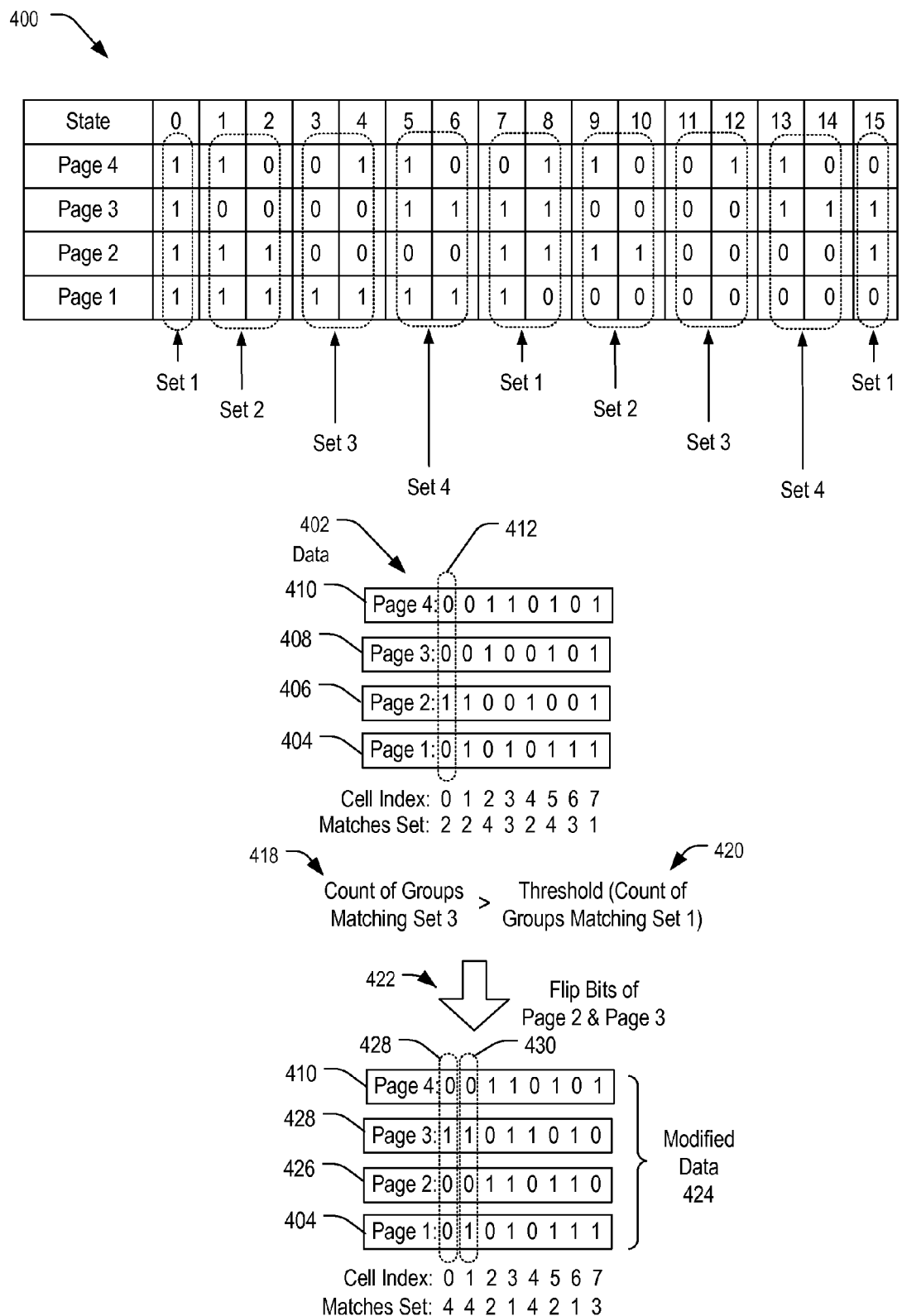
FIG. 4 is a general diagram that illustrates modifying data based on matching bit patterns for a memory that stores four bits per storage element.

Referring to FIG. 4, an illustrative embodiment of changing multiple bits of data in response to groups of bits matching one or more bit patterns is depicted and generally designated 400. As opposed to FIG. 3, where each memory element was illustrated as having eight possible states (states 0-7), the example of FIG. 4 illustrates 16 possible states (states 0-15) for each memory element, such as a 4-bit MLC cell. The states 0-15 are logically partitioned into four sets, including a first set (Set 1) corresponding to states 0, 7-8, and 15, a second set (Set 2) corresponding to states 1-2 and 9-10, a third set (Set 3) corresponding to states 3-4 and 11-12, and a fourth set (Set 4) corresponding to states 5-6 and 13-14. Bit values corresponding to the states 0-15 are illustrated as bits corresponding to a first page, a second page, a third page, and a fourth page.

Only one bit transition occurs on the first page (between state 7 and state 8), four transitions occur on the second page, four transitions occur on the third page, and seven transitions occur on the fourth page. As a result, the fourth page is statistically more likely to experience bit errors as a result of a change in a state of the memory element, such as a change in the threshold voltage of an MLC cell. The bits corresponding to the fourth page in the first set (i.e. states 0, 7-8, and 15)

include a single bit transition, while the bits corresponding to the fourth page in each of Sets 2-4 exhibit two transitions. Therefore, storing a group of bits within a memory cell having a bit pattern matching Set 1 increases reliability of the stored data as compared to storing a group of bits having a bit pattern matching any of the bit patterns of Set 2, Set 3, or Set 4.

Data 402 may be received and includes a first page 404, a second page 406, a third page 408, and a fourth page 410. Groups of bits of the data 402, such as a first representative group 412, may be compared to data patterns of one or more of the sets, such as Set 3. Each of the groups of bits may be identified as matching a pattern in a particular set. For example, the group 412 has a bit pattern "0010" that matches the bit pattern "0010" in Set 2 (state 10). The group 412 therefore corresponds to Set 2. Likewise, the group formed of the bits of each of the pages 404-410 having index "1" has a bit pattern "0011" that matches the bit pattern "0011" in Set 2 (state 2) and therefore corresponds to Set 2. The group formed of the bits having index "2" has a bit pattern "1100" that matches the bit pattern "1100" in Set 4 (state 13) and therefore corresponds to Set 4.

A comparison is made whether a count 418 of groups of the data 402 matching Set 3 exceeds a threshold 420. For example, the threshold 420 may be a count of the number of groups matching Set 1. As illustrated, the representative data 402 includes two groups matching Set 3 and a single group matching Set 1. As a result of the comparison, a bit flip operation 422 may be performed that flips all bits of the second page 406 and the third page 408. Flipping all bits of the second page 406 and the third page 408 causes all groups matching a data pattern in Set 3 to instead match a data pattern in Set 1 and causes all groups matching a data pattern in Set 1 to instead match a data pattern in Set 3 (and causes a similar exchange between Sets 2 and 4).

Modified data 424 resulting from the bit flip operation 422 includes the first page 404, the modified second page 426, the modified third page 428, and the fourth page 410. As illustrated, groups matching Set 2 in the data 402 match Set 4 in the modified data 424, such as a first representative group 428 and a second representative group 430. Groups matching Set 3 in the data 402 match Set 1 in the modified data 424. The modified data 424 includes two groups matching Set 1 and a single group matching Set 3. As a result, the modified data 424 is statistically more reliable than the data 402 due to the reduced sensitivity of bit values in the fourth page 410 to changes in the cell state, such as changes in a threshold voltage of a flash MLC cell.

Figure 5:
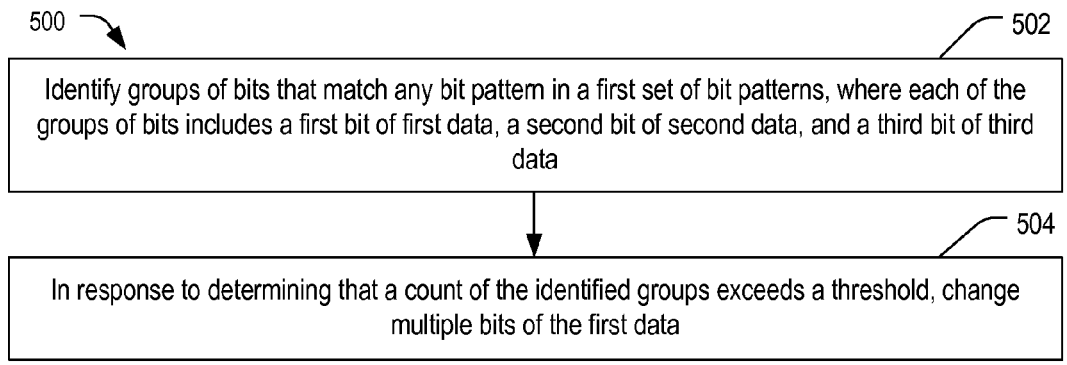
FIG. 5 is a flow chart of a first particular illustrative embodiment of a method of modifying data based on matching bit patterns.

Referring to FIG. 5, a particular embodiment of a method 500 is depicted. The method 500 may be performed in a data storage device, such as the data storage device 102 of FIG. 1. Groups of bits are identified that match any bit pattern in a first set of bit patterns, at 502. Each of the groups of bits includes a first bit of first data, a second bit of second data, and a third bit of third data. The groups of bits may be formed of bit values having common indices, such as the first group 310 of FIG. 3 that is formed of the bits having a "0" index in the pages 304-308.

In response to determining that a count of the identified groups exceeds a threshold, multiple bits of the first data are changed, at 504. Changing the multiple bits of the first data reduces a number of the groups of bits that match any bit pattern in the first set of bit patterns.

The threshold may correspond to a number of groups of bits that match any bit pattern in the second set of bit patterns. For example, the threshold 420 of FIG. 4 is set to a count of groups matching any bit pattern in Set 1. In a particular implementation, the threshold may be half of a total number of bits in the first data. For example, the threshold 320 of FIG. 3 has a value (i.e. four) that is half of the number of bits in the first page 304 (i.e. eight).

Changing multiple bits of the first data may include changing all of the bits in the first data. The first data may correspond to a first logical page. For example, as described with respect to FIG. 3, when the number of groups of bits that match any bit pattern in the first set of bit patterns 316 exceeds the number of groups of bits that match any bit pattern in the second set of bit patterns 317, all bits in the first page 304 may be changed (i.e. by flipping all bits in the first page 304 from "1" to "0" and from "0" to "1"). An indicator may be stored to indicate that all of the bits of the first page 304 have been changed. In other embodiments, fewer than all bits of the first page 304 may be changed.

The first set of bit patterns may correspond to a lower reliability of the second bit as compared to a second set of bit patterns when the first bit, the second bit, and the third bit of a group of bits are stored to a single memory element. For example, the single memory element may be a flash multi-level cell (MLC).

In some implementations, each group may have more than three bits. For example, each group may also have a fourth bit of fourth data as illustrated in FIG. 4. In response to determining that the count of the identified groups exceeds the threshold, multiple bits of the second data may be changed. For example, the first data may correspond to the second page 406 and the second data may correspond to the third page 408 of FIG. 4. Changing the multiple bits of the second data further reduces the number of the groups of bits that match any bit pattern in the first set of bit patterns (e.g. Set 3 of FIG. 3).

Figure 6:
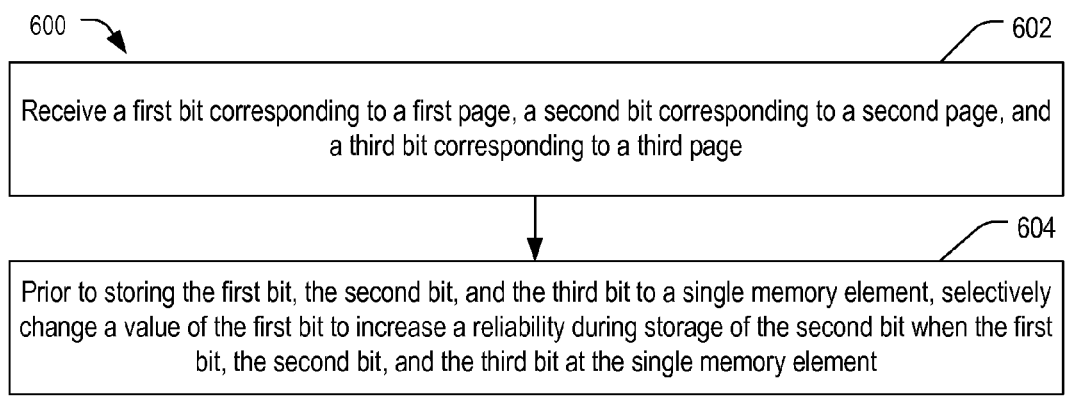
FIG. 6 is a flow chart of a second particular illustrative embodiment of a method of modifying data based on matching bit patterns.

Referring to FIG. 6, a particular embodiment of a method 600 is depicted. The method 500 may be performed in a data storage device, such as the data storage device 102 of FIG. 1. A first bit corresponding to a first page, a second bit corresponding to a second page, and a third bit corresponding to a third page are received, at 602. For example, the first bit, the second bit, and the third bit may correspond to the group 310 of FIG. 3.

Prior to storing the first bit, the second bit, and the third bit to a single memory element, a value of the first bit is selectively changed to increase a reliability of the second bit during storage of the first bit, the second bit, and the third bit at the single memory element, at 602. For example, the single memory element may be a multi-level cell of a flash memory. The reliability of storing the second bit may be increased by decreasing sensitivity of a value of the second bit to changes in a threshold voltage of the multi-level cell.

To illustrate, in response to determining that the count 318 exceeds the threshold 320 of FIG. 3, the value of the bit of the first page 304 in the first group 310 is flipped, changing the first group from "010" (matching state "4" in the first set 316) to "011" (matching state "5" in the second set 317). In other implementations, the value of the first bit may be selectively changed based on one or more other criteria. For example, the first bit may be selectively changed upon determining that the first bit, the second bit, and the third bit match a bit pattern in the first set 316.

Although various components depicted herein are illustrated as block components and described in general terms, such components may include one or more microprocessors, state machines, or other circuits configured to enable the comparator 122 of FIG. 1 or the bit flipper 126 of FIG. 1 to perform the particular functions attributed to such components. For example, the comparator 122 may represent physical components, such as hardware controllers, state machines, logic circuits, or other structures, to enable the controller 120 of FIG. 1 to identify groups of bits matching any bit pattern in the first set of bit patterns 124.

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may be coupled to a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   in a data storage device including a memory that has a three-dimensional (3D) memory configuration, the data storage device further including a controller associated with operation of memory cells of the memory, performing:
   identifying groups of bits that match any bit pattern in a first set of bit patterns, wherein each of the groups of bits includes a first bit of first data, a second bit of second data, and a third bit of third data; and
   in response to determining that a count of the identified groups exceeds a threshold, changing multiple bits of the first data,
   wherein changing the multiple bits of the first data reduces a number of the groups of bits that match any bit pattern in the first set of bit patterns.

2. The method of claim 1, wherein changing multiple bits of the first data includes changing all of the bits of the first data.

3. The method of claim 1, wherein the first data corresponds to a first logical page.

4. The method of claim 1, wherein each bit pattern in the first set of bit patterns is different from every other bit pattern in the first set of bit patterns.

5. The method of claim 1, wherein the first set of bit patterns corresponds to a lower reliability of the second bit of a group of bits stored to a single memory element as compared to a second set of bit patterns.

6. The method of claim 5, wherein each bit pattern in the second set of bit patterns is different from each bit pattern in the first set of bit patterns.

7. The method of claim 5, wherein the single memory element is a flash multi-level cell (MLC).

8. The method of claim 5, wherein the threshold corresponds to a number of groups of bits that match any bit pattern in the second set of bit patterns.

9. The method of claim 1, wherein the threshold is half of a total number of bits in the first data.

10. The method of claim 1, wherein the groups of bits are formed of bits having common indices.

11. The method of claim 1, wherein each group further comprises a fourth bit of fourth data and further comprising, in response to determining that the count of the identified groups exceeds the threshold, changing multiple bits of the second data, wherein changing the multiple bits of the second data further reduces the number of the groups of bits that match any bit pattern in the first set of bit patterns.

12. A method comprising:
   in a data storage device including a memory that has a three-dimensional (3D) memory configuration, the data storage device further including a controller associated with operation of memory cells of the memory, performing:
   receiving a first bit corresponding to a first page, a second bit corresponding to a second page, and a third bit corresponding to a third page; and
   prior to storing the first bit, the second bit, and the third bit to a single memory element, selectively changing a value of the first bit to increase a reliability of the second bit during storage of the first bit, the second bit, and the third bit at the single memory element.

13. The method of claim 12, wherein the single memory element is a multi-level cell of the memory and the memory is a flash memory.

14. The method of claim 13, wherein the reliability is increased by decreasing sensitivity of a value of the second bit to changes in a threshold voltage of the multi-level cell.

15. A data storage device comprising:
   a memory that has a three-dimensional (3D) memory configuration; and
   a controller coupled to the memory, wherein the controller is associated with operation of memory cells of the memory and is configured to identify groups of bits that match any bit pattern in a first set of bit patterns, wherein each of the groups of bits includes a first bit of first data, a second bit of second data, and a third bit of third data to be stored at the memory, and in response to determining that a count of the identified groups exceeds a threshold, to change multiple bits of the first data,
   wherein changing the multiple bits of the first data reduces a number of the groups of bits that match any bit pattern in the first set of bit patterns.

16. The data storage device of claim 15, wherein the controller is configured to change all of the bits of the first data in response to determining that the count exceeds the threshold.

17. The data storage device of claim 15, wherein the first data corresponds to a first logical page.

18. The data storage device of claim 15, wherein each bit pattern in the first set of bit patterns is different from every other bit pattern in the first set of bit patterns.

19. The data storage device of claim 15, wherein the first set of bit patterns corresponds to a lower reliability of the second bit of a group of bits stored to a single memory element of the memory as compared to a second set of bit patterns.

20. The data storage device of claim 19, wherein the memory is a flash multi-level cell (MLC) memory.

21. The data storage device of claim 19, wherein the threshold corresponds to a number of groups of bits that match any bit pattern in the second set of bit patterns.

22. The data storage device of claim 15, wherein the threshold is half of a total number of bits in the first data.

23. The data storage device of claim 15, wherein each group further comprises a fourth bit of fourth data and wherein the controller is further configured, in response to determining that the count of the identified groups exceeds the threshold, to change multiple bits of the second data, wherein changing the multiple bits of the second data further reduces the number of the groups of bits that match any bit pattern in the first set of bit patterns.

24. A data storage device comprising:
a memory that has a three-dimensional (3D) memory configuration; and
a controller coupled to the memory, wherein the controller is associated with operation of memory cells of the memory and is configured, prior to storing a first bit corresponding to a first page, a second bit corresponding to a second page, and a third bit corresponding to a third page to a single memory element of the memory, to selectively change a value of the first bit to increase a reliability of the second bit during storage of the first bit, the second bit, and the third bit at the single memory element.

25. The data storage device of claim 24, wherein the memory comprises a flash memory and wherein the single memory element is a multi-level cell of the flash memory.

26. The data storage device of claim 25, wherein the reliability is increased by decreasing sensitivity of a value of the second bit to changes in a threshold voltage of the multi-level cell.

* * * * *